(12) United States Patent
Nandakumar Raghav

(10) Patent No.: US 12,156,072 B2
(45) Date of Patent: Nov. 26, 2024

(54) DYNAMIC MANAGEMENT OF VEHICLE SENSOR DATA BASED ON FORECAST NETWORK CONDITIONS

(71) Applicant: Urban Robotics, Inc., Las Vegas, NV (US)

(72) Inventor: Anand Nandakumar Raghav, Las Vegas, NV (US)

(73) Assignee: Urban Robotics, Inc., Las Vegas, NV (US)

( * ) Notice: Subject to any disclaimer, the term of this patent is extended or adjusted under 35 U.S.C. 154(b) by 0 days.

(21) Appl. No.: 18/699,796

(22) PCT Filed: Aug. 29, 2023

(86) PCT No.: PCT/US2023/073096
§ 371 (c)(1),
(2) Date: Apr. 9, 2024

(87) PCT Pub. No.: WO2024/050369
PCT Pub. Date: Mar. 7, 2024

(65) Prior Publication Data
US 2024/0334236 A1     Oct. 3, 2024

Related U.S. Application Data

(60) Provisional application No. 63/373,994, filed on Aug. 30, 2022.

(51) Int. Cl.
*H04W 28/02* (2009.01)
*H04L 41/147* (2022.01)
(Continued)

(52) U.S. Cl.
CPC ....... *H04W 28/0231* (2013.01); *H04L 41/147* (2013.01); *H04W 4/44* (2018.02); *H04W 28/06* (2013.01)

(58) Field of Classification Search
None
See application file for complete search history.

(56) References Cited

U.S. PATENT DOCUMENTS 9,451,051 B1 *  9/2016  Ray ....................... H04L 67/131
10,659,991 B2    5/2020  Pedersen et al.
(Continued)

FOREIGN PATENT DOCUMENTS

CA    3109917 A1 *  2/2020  ........ B60W 30/0956
CN    110769453 A  *  2/2020
(Continued)

*Primary Examiner* — Kenny S Lin
(74) *Attorney, Agent, or Firm* — Holzer Patel Drennan

(57) ABSTRACT

Data management of vehicle data for communication to a remote location is provided, including obtaining one or more sensor data feeds from one or more onboard sensors of a vehicle, generating a forecast network condition for a network with which the vehicle is in operative communication, the forecast network condition representing predicted network resources the network is predicted to provide to the vehicle, providing the forecast network condition to a compression engine, and compressing the one or more sensor data feeds into a compressed data feed for communication over the network to a remote location, wherein the compressed data feed is compressed based on the forecast network condition.

24 Claims, 8 Drawing Sheets

(51) Int. Cl.
*H04W 4/44* (2018.01)
*H04W 28/06* (2009.01)

(56) References Cited

U.S. PATENT DOCUMENTS

| | | |
|---|---|---|
| 2005/0210515 A1* | 9/2005 | Roh .................. H04N 7/163 |
| | | 725/62 |
| 2011/0221901 A1* | 9/2011 | Bai .................. H04N 19/124 |
| | | 382/104 |
| 2015/0120087 A1 | 4/2015 | Duan et al. |
| 2018/0261020 A1 | 9/2018 | Petousis et al. |
| 2019/0045399 A1 | 2/2019 | Bongaarts et al. |
| 2020/0153926 A1 | 5/2020 | Slater |
| 2020/0177885 A1* | 6/2020 | Brugman .............. H04N 19/31 |
| 2020/0307586 A1 | 10/2020 | Patel et al. |
| 2022/0089181 A1 | 3/2022 | Gross et al. |
| 2022/0303331 A1* | 9/2022 | Svennebring .... H04N 21/44209 |

FOREIGN PATENT DOCUMENTS

| | | | | |
|---|---|---|---|---|
| CN | 112867020 A | * | 5/2021 | ............ H04W 16/18 |
| DE | 102016226050 A1 | | 6/2018 | |
| GB | 2542494 A | | 3/2017 | |

* cited by examiner

DYNAMIC MANAGEMENT OF VEHICLE SENSOR DATA BASED ON FORECAST NETWORK CONDITIONS

CROSS-REFERENCE TO RELATED APPLICATIONS

This application claims a benefit of priority to U.S. Provisional Application No. 63/373,994, entitled "DYNAMIC MANAGEMENT OF VEHICLE SENSOR DATA BASED ON FORECAST NETWORK CONDITIONS," and filed on Aug. 30, 2022, which is specifically incorporated by reference herein for all that it discloses and teaches.

BACKGROUND

Technological advances have provided significant improvements in transportation. For example, some vehicles now provide at least some level of autonomous control over the vehicle. Further still, other approaches have been proposed that allow for a remote operator to control a vehicle for all or a portion of a vehicle's operation. As may be appreciated, such approaches may allow for increased efficiency and convenience for transportation solutions.

However, safety continues to be a priority for such new approaches to autonomous or remote vehicle control. While some autonomous control systems may execute locally at a vehicle, there may be advantages to providing data from a vehicle to a remote location for supervision, data analysis, and/or to facilitate remote control of a vehicle. In this regard, the reliability of data communication between a vehicle and a remote location may greatly impact the safety of a vehicle. In turn, continued improvements in the manner in which data is communicated from a vehicle are needed to bolster security and functionality for vehicles.

SUMMARY

In some aspects, the techniques described herein relate to a method for data management of vehicle data for communication to a remote location. The method includes obtaining one or more sensor data feeds from one or more onboard sensors of a vehicle; generating a forecast network condition for a network with which the vehicle is in operative communication, the forecast network condition representing predicted network resources the network is predicted to provide to the vehicle; providing the forecast network condition to a compression engine; and compressing the one or more sensor data feeds into a compressed data feed for communication over the network to a remote location, wherein the compressed data feed is compressed based on the forecast network condition.

In some aspects, the techniques described herein relate to an onboard vehicle system for generating forecast network conditions for data management of sensor data at a vehicle. The onboard vehicle system includes at least one sensor that generates a sensor data feed; a communication module in operative communication with a network; a network prediction module operative to generate a forecast network condition for the network with which the communication module is in operative communication, the forecast network condition representing predicted network resources the network is predicted to provide to the vehicle; and a compression engine operative to compress the sensor data feed, wherein the compression engine receives the forecast network condition and compresses the sensor data feed based on the forecast network condition for communication of a compressed sensor data feed by the communication module to a remote location via the network.

This summary is provided to introduce a selection of concepts in a simplified form. The concepts are further described below in the Detailed Description. This summary is not intended to identify key features or essential features of the claimed subject matter, nor is it intended to be used to limit the scope of the claimed subject matter.

Other implementations are also described and recited herein.

DETAILED DESCRIPTION

Figure 1:
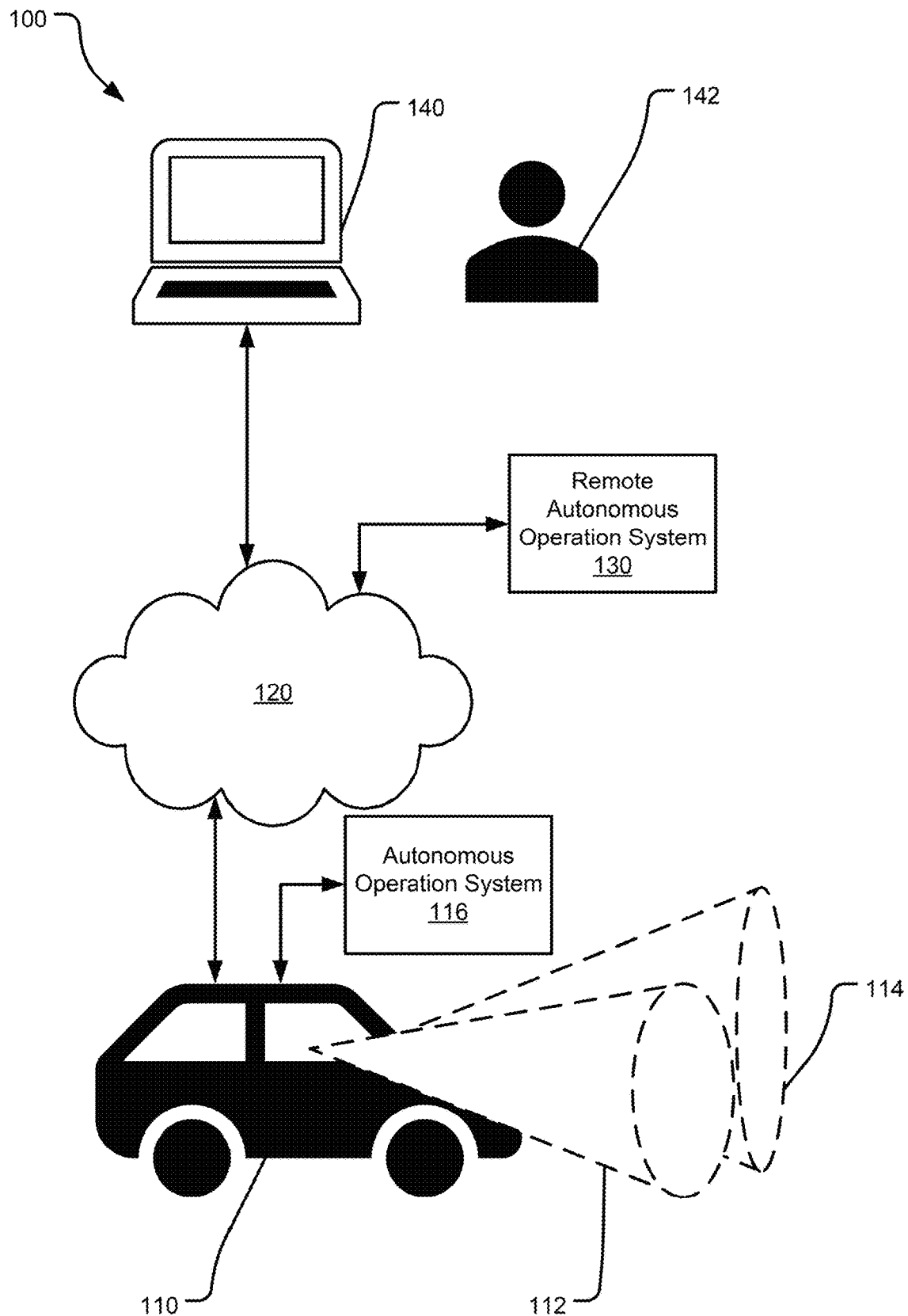
FIG. 1 illustrates an example system for dynamic management of sensor data.

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the scope of the invention as defined by the claims.

The present disclosure generally relates to improved functionality related to the communication of data from a vehicle to a remote location. For example, in the contexts of autonomous vehicle control or remote vehicle control, data may be supplied from a vehicle to a remote location for the purpose of controlling the vehicle. In this regard, consistent, high-quality data is advantageously provided to the remote location in a manner sufficient to facilitate control of the vehicle. The present disclosure generally relates to approaches for data management that use predictive approaches to proactively process data for the communication of the data from a vehicle to a remote location.

Communication networks experience variability in the ability to communicate data. For example, networks may experience variability in relation to the total amount of bandwidth available, the latency of data exchange, packet loss, and other potential network variables. As such, if network conditions degrade, the ability to reliably communicate data between a vehicle and a remote location may be adversely affected. Particularly when the remote location is providing control data back to the vehicle, consistency of data delivery from the vehicle may impact the safe operation of the vehicle. In this regard, it has been recognized that while data management may help address network shortcomings (e.g., by providing higher compression, prioritization of data feeds, etc.), unexpected changes in network conditions may preclude such management as the data management techniques may not sufficiently address network shortcomings in real-time.

Using predictive approaches for proactive management of the data generated by, and provided from, the vehicle over the network to a remote location may facilitate improved operation of the vehicle and a vehicle control system. Specifically, by using predictive approaches for proactive data management, even in the case where network performance (e.g., available network resources) degrades, a vehicle may process data in a manner that allows sufficient quality of data to be communicated for continuous control of the vehicle. Accordingly, it may be advantageous to accurately predict future network conditions such that data may be processed at a vehicle in a proactive way such that the data may be continuously and reliably communicated to the remote location.

As such, the present disclosure may include a network prediction module that is operative to forecast network conditions based on predictive input data regarding conditions of a network connecting a vehicle and a remote location. In turn, forecast network conditions may be used to control the manner in which data is processed at the vehicle prior to communication of the data to the remote location. In this regard, the network prediction module allows for proactive data management that may provide a number of advantages in relation to vehicle control. Because the network prediction module may forecast network conditions and allow for data to be processed according to those forecast network conditions, data may be reliably communicated from a vehicle to a remote location even in the event that network performance degrades. Rather than experiencing network degradation and responding to the degraded network performance, the forecast network conditions may be used to proactively manage data processing at the vehicle. As may be appreciated, reactive processing that responds to current network conditions for data processing may result in disruptions to data delivery that may impact the ability to safely control a vehicle from a remote location. Proactive data management based on forecast network conditions facilitates consistency of data delivery, thus reducing discontinuities in data delivery or situations in which data cannot be delivered to a remote location. As may be appreciated, any interruption, discontinuity, or failure of data delivery may severely impact the safety of vehicle operation, as such data may be important to the reliable operation from the remote location.

FIG. 1 illustrates an example of a system 100 for dynamic management of sensor data. With reference to FIG. 1, a system 100 in which the present disclosure may be utilized is described. Specifically, the vehicle 110 may communicate to a remote location via a network 120. The vehicle 110 may include one or more sensors that collect data regarding the vehicle 110, the environment of the vehicle 110, or other data that may be useful in controlling the operation of the vehicle 110 (e.g., control status, etc.). For example, the vehicle 110 may be equipped with a first camera with a first field of view 112 and a second camera with a second field of view 114. As may be appreciated, the vehicle 110 may communicate data regarding the first field of view 112 and second field of view 114 via the network 120 to a remote location. The remote location may use the data regarding the view 112 and the view 114 to provide control commands to the vehicle.

In FIG. 1, a number of example remote locations are shown. For example, the vehicle 110 may include an autonomous operation system 116. In connection with the operation of the autonomous operation system 116, at least some data may be delivered to a remote autonomous operation system 130. In another example, a remote terminal 140 may receive the data from the vehicle 110 (e.g., from an onboard vehicle system) over the network 120. The remote terminal 140 may be used by a remote operator 142 to control the operation of the vehicle 110 based on the data from at least the first field of view 112 and the second field of view 114. Thus, it may be appreciated that reliable communication of data via the network 120 between the vehicle 110 and either the remote autonomous operation system 130 or the remote terminal 140 may facilitate the safe operation of the vehicle 110. While the two contexts of a remote autonomous operation system 130 or a remote terminal 140 are provided in FIG. 1, it may be appreciated that the present approach to communication of data from the vehicle 110 to a remote location may be provided in other contexts without limitation.

In some contexts, a minimum network condition may be determined or predetermined that describes a predefined static or dynamic minimum network performance (e.g., bandwidth or data rate) to communicate data in a manner predetermined to be sufficient for remote control of the vehicle (e.g., by a remote operator 142 or a remote autonomous operation system 130). The vehicle may generate forecast network conditions representing the predicted network performance (e.g., bandwidth, data rate, or other network resources) the vehicle 110 will experience over a predefined duration. In turn, the minimum network condition may be compared to one or more of the forecast network conditions. In the event that a forecast network condition is predicted to fail a safety threshold of network resources (e.g., dropping below a threshold amount of network resources represented by the minimum network condition), a safety condition may be triggered. Triggering of the safety condition may result in the vehicle executing a safety operation to safely bring the vehicle into a safe condition (e.g., an emergency stop or navigating to a safe location to render the vehicle safe).

Figure 2:
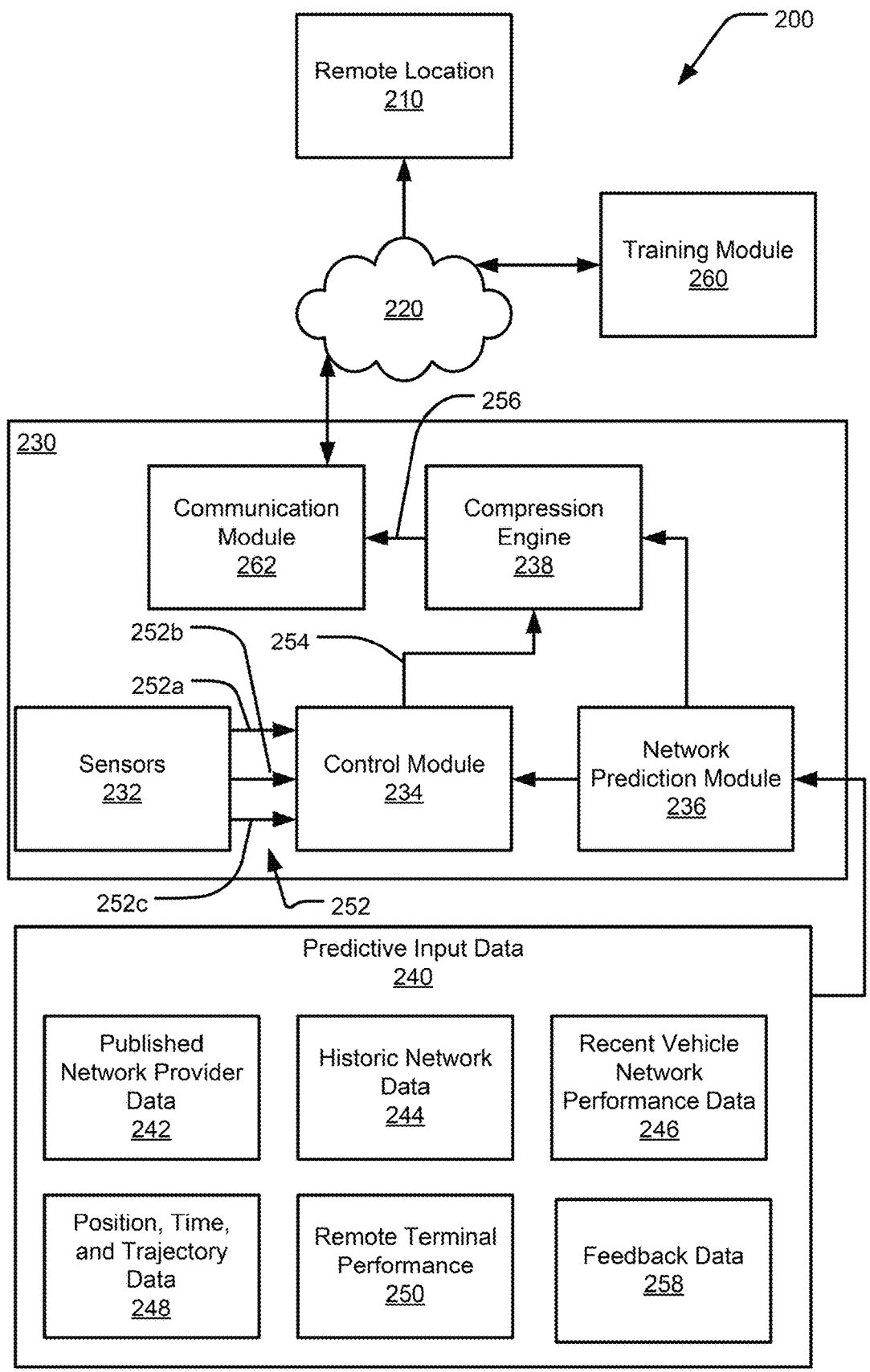
FIG. 2 illustrates a schematic view of an example system for dynamic management of sensor data.

FIG. 2 illustrates a schematic view of an example of a system 200 for dynamic management of sensor data. The system 200 may include a vehicle 230 that is generally in communication with a network 220 to provide data from the vehicle 230 to a remote location 210. As described above, the remote location 210 may be any remote location to which data is communicated from the vehicle 230 via the network 220. Accordingly, the remote location 210 may be a remote autonomous operation system or a remote terminal for remote control of the vehicle 230. That is, the data communicated from the vehicle 230 to the remote location 210 may be vehicle sensor data used by the remote location 210 to generate or otherwise provide control commands to the vehicle 230 for control of the vehicle 230.

The vehicle 230 may include one or more sensors 232 (e.g., an onboard sensor). The one or more sensors 232 may comprise cameras that include discrete or overlapping fields of view relative to the vehicle 230 as described above in relation to FIG. 1. Other types of sensors 232 may also be provided without limitation, such as Lidar sensors, time-of-flight sensors, three-dimensional scanning sensors, radar sensors, or any other sensor data that may be communicated to the remote location 210. Thus, while video data feeds from cameras are generally described herein, it should be understood that the approaches described may be utilized in relation to any data feed provided from the vehicle 230 to the remote location 210 via the network 220.

The sensors 232 may provide sensor data feeds 252 to a control module 234. Specifically, FIG. 2 illustrates three sensor data feeds 252, comprising a first sensor data feed 252*a*, a second sensor data feed 252*b*, and a third sensor data feed 252*c*. The sensor data feeds 252 in FIG. 2 are intended to be illustrative only, and additional or fewer sensor data feeds 252 may be provided without limitation. In one example, the first sensor data feed 252*a* may comprise a front-facing camera video feed, the second sensor data feed 252*b* may comprise a left-facing camera video feed, and the third sensor data feed 252*c* may comprise a right-facing camera video feed.

The control module 234 may be operative to combine the sensor data feeds 252 and provide a video feed 254 to a compression engine 238. As described further below, the video feed 254 may be a composite video feed that is generated by combining the first sensor data feed 252*a*, the second sensor data feed 252*b*, and/or the third sensor data feed 252*c*. The compression engine 238 may be operative to compress the video feed prior to communication of a compressed video feed 256 to a communication module 262 for communication of the compressed video feed 256 via the network 220 to the remote location 210. As may be appreciated, the size of a resulting compressed video feed 256 may be controlled based on the level of compression applied. However, compressing the data may also result in a degradation in quality. As such, the compression engine 238 may maximize the video quality or maintain a predefined video quality (e.g., a predefined number of pixels, color scheme, type of compression, and/or framerate) while sufficiently compressing the compressed video feed 256 to allow for continuous data communication via the network 220.

The control module 234, network prediction module 236, compression engine 238, and/or communication module 262 may include any appropriate hardware, software, firmware, or combination thereof for providing the functionality described herein. As an example, the control module 234, network prediction module 236, compression engine 238, and/or communication module 262 may include machine-readable instructions that are stored in a memory of a computing device. The computing device may include one or more hardware processors operative to retrieve and execute the machine-readable instructions for performing the functionality described herein. An exemplary computing device is shown and described in greater detail below that may be used to execute one or more of the control module 234, network prediction module 236, compression engine 238, and/or communication module 262. In other examples, other hardware and/or software may be provided for executing the control module 234, network prediction module 236, compression engine 238, and/or communication module 262, including, for example, application-specific integrated circuits (ASICs), field-programmable gate arrays (FPGAs), or other computing devices.

Moreover, the communication module 262 may include a modem that may be operative to communicate with access points of the network 220. The network 220 may be a cellular network, a wide area network, or any other appropriate network. In an example, the network 220 may include a 5G cellular network, and the communication module 262 may include a 5G-enabled device capable of transmitting data and receiving data via the network 220.

The vehicle 230 may also include a network prediction module 236 configured to generate forecast network conditions at some time in the future based on one or more predictive input data 240. Specifically, the network prediction module 236 may provide the forecast network conditions comprising information regarding one or more predicted network characteristics to the control module 234 and/or the compression engine 238. As described in greater detail below, the forecast network condition may be provided to the control module 234 to assist in processing the sensor data feeds 252 prior to providing the video feed to the compression engine 238. Moreover, the forecast network condition provided from the network prediction module 236 to the compression engine 238 may be utilized to select a compression to apply to the video feed prior to communication of the compressed video feed to the network 220.

The forecast network condition may include or relate to any one or more characteristics of the network 220 that may affect the ability to transmit data via the network 220. Examples of forecast network conditions may include available upload bandwidth, available download bandwidth, network latency, network congestion, network signal strength, network mode (e.g., 3G, 4G, 5G, etc.), packet loss, jitter, etc. Moreover, the forecast network condition may comprise a combination of any or all of the foregoing parameters without limitation. Further still, the forecast network condition may comprise an aggregate of one or more of the foregoing parameters. Implementations are contemplated in which the communication module 262 has access to more than one network service provider and/or more than one network, including the network 220. In these implementations, the forecast network condition(s) may be based on data rates or bandwidth available for one or more of the network service providers or networks providing service to the communication module 262.

In one example of the system 200, the plurality of sensor data feeds 252 from the sensors 232 may comprise camera feeds from various cameras aboard the vehicle. In this example, the control module 234 may be operative to combine the respective sensor data feeds 252 of the sensors into the video feed 254 provided to the compression engine 238. For example, the first sensor data feed 252*a*, second sensor data feed 252*b*, and third sensor data feed 252*c* may be aggregated to provide a composite video feed comprising the front-facing, left-facing, and right-facing video feeds such that the video feed 254 comprises an aggregate video data feed that is provided to the compression engine 238. The control module 234 may prioritize the sensor data feeds 252 when generating the aggregate video feed (e.g., at least in part, based on forecast network conditions received from the network prediction module 236). The prioritization of the sensor data feeds 252 may be utilized to adjust bitrates or other data rates of the sensor data feeds 252 included in the video feed 254. For example, the first sensor data feed 252*a* corresponding to a front-facing camera may be prioritized relative to the second sensor data feed 252*b* and the third sensor data feed 252*c* corresponding to the side-facing cameras. In this regard, the first sensor data feed 252*a* may be provided in the video data at a higher bitrate (thus providing a higher quality video image) as compared to the second sensor data feed 252*b* or the third sensor data feed 252*c*.

The manner in which the sensor data feeds 252 are processed and/or compressed may be based at least in part on an operational condition of the vehicle 230. An operational condition of the vehicle is a measured, indicated, transmitted, received, determined, or otherwise provided state of the vehicle 230 or of the vehicle's components. Examples of operation conditions of the vehicle include an orientation of the vehicle relative to a road, whether a turn signal is activated, whether the windshield wipers are activated or functioning, the position and/or orientation of the steering wheel, whether a trip planner (e.g., GPS) dictates the vehicle 230 should change direction, the direction in which the vehicle is traveling, whether a warning (e.g., an indicator) is activated in the vehicle, whether a vehicle is turning, whether a vehicle is backing up, shifter positions (e.g., park, brake, emergency brake, gear, reverse, neutral, etc.), whether the vehicle 230 is transitioning to or from a parked state, whether a trunk is open, whether a gas access panel is open, whether the lights are on, whether the lights are functioning, a position of the brake pedal (or corresponding percentage of brake power applied), whether a seatbelt is fastened, whether a passenger is indicated as present without a seatbelt, whether a local pilot within the vehicle 230 is engaged with any controls of the vehicle 230, or the like.

Moreover, the prioritization of the sensor data feeds 252 by the control module 234 may be at least in part based on the operational condition of the vehicle. For instance, a front-facing camera feed corresponding to the first sensor data feed 252a may be prioritized (e.g., provided at a higher bitrate in the resulting aggregate video feed) when the vehicle is moving forward or when other vehicle conditions occur (e.g. when the vehicle is put into forward gear or in a drive mode). While not shown, a reverse camera may generate another sensor data feed that may be prioritized by the control module 234 in the event that the vehicle is moving backward or when other vehicle conditions occur (e.g., the vehicle has been placed in reverse gear or reverse mode). Similarly, upon detection of a rear unsafe condition, the control module 234 or the compression engine 238 may prioritize a feed to the rear camera. A rear unsafe condition may be triggered when another vehicle approaches quickly from the rear or when the control module detects that an operator of the other vehicle to the rear is directing eyes in a direction other than the direction in which the other vehicle is driving.

Moreover, steering inputs may be monitored such that different ones of the sensor data feeds 252 may be prioritized based on the steering input. For example, the left-facing camera generating the second video data feed 25b may be prioritized as the vehicle turns left (as determined by a steering input to the left), whereas the right-facing camera generating the third sensor data feed 252c may be prioritized in the event that the vehicle turned right (as determined by a steering input to the left). In any regard, the control module 234 may be operative to generate the video data feed provided to the compression engine 238 such that the video data feed comprises a single stream of data whose parameters, such as a data rate or the like, may be monitored. Further implementations are contemplated where a first portion of a sensor feed is prioritized for higher-quality sensor data relative to other portions of the sensor feed.

In implementations in which the remote location includes a remote pilot, the compression engine may prioritize sensor feeds or portions of sensor feed data that represents the virtual field of view of the remote pilot. For example, the position of a virtual reality headset or of the remote pilot's eyes can be tracked to allow the compression engine 238 and/or control module 234 to provide higher quality sensor data (e.g., lower compression or higher frame rate video) corresponding to the center of the remote pilot's field of view relative to the periphery of the remote pilot's field of view.

Continuing the example in which the video feed to the compression engine 238 is an aggregated video feed comprising a combination of the sensor data feeds 252 and having a single bitrate or other data rate, the network prediction module 236 may provide the forecast network condition to the compression engine 238 as a single value parameter. The single value parameter may include a given network condition, such as the forecast network bandwidth, or may be an aggregated parameter comprising a forecast network condition score. In any regard, the forecast network condition may comprise a value to which the video feed 254 may be compared to determine, based on predefined rules or an inferential model, a compression to apply to the video feed 254 by the compression engine 238 (e.g., compression sufficient to allow for real-time transmission in the present network environment). For example, the forecast network condition may comprise a predicted bandwidth that provides a predicted data rate, which may be directly compared to a data rate (e.g., bitrate) of the video feed 254 to determine how the video feed 254 is to be compressed for communication via the network 220.

Accordingly, utilizing the control module 234 to combine the respective sensor data feeds 252 into a single video feed 254 that is provided to the compression engine 238 may provide simplicity in the comparison between the forecast network condition and the compressed video data rate. That is, the data rates of the sensor data as compressed in the compressed video feed 256 may simply be compared to the forecast network condition to determine whether the data video of the compressed video feed 256 may be communicated in view of the forecast network conditions. Given the simplicity of the one-to-one comparison of the data rate of the resulting compressed video feed 256 to the forecast network condition, this approach may provide computational simplicity that provides efficient and quick computation of the required compression to be applied to the sensor data and/or may allow the determination of whether the sensor data may be communicated in a safe manner. That is, the computation of the target data rate for the resulting compressed video feed 256 based on the forecast network condition may provide for efficient processing. The efficient processing may shorten the time needed to determine the data rate for the resulting compressed video feed 256 and/or to identify a scenario in which the forecast network condition does not support the transmission of data.

In implementations, in order to determine the data rate for the resulting compressed video feed 256, the compression engine 238 may include a predefined rule set to determine each compression (e.g., extent, type, and nature) to apply to outgoing data feeds based on the forecast network condition and/or the minimum network condition. The compression engine may alternatively or additionally include an inferential model to determine, independently or in cooperation with a predefined rule set, the data rate for the resulting compressed video feed 256.

In relation to the forecast network condition not supporting transmission of data, the compression engine 238 may identify a situation in which the forecast network condition does not support transmission of the compressed video feed 256 (or other sensor data) at a minimum network condition. In this case, the compression engine 238 or the control module 234 may determine that the forecast network condition fails a safety threshold of network resources and responsively trigger a safety condition based on the identification that the forecast network condition does not sufficiently support the minimum network condition (e.g., minimum network resources) predetermined to reliably provide the compressed video feed 256 to the remote location 210. The safety threshold may be based on a predefined range or a predefined minimum quantity of network resources (e.g., bandwidth, data rate, or latency). As described in greater detail below, triggering the safety condition may provide a remote driver, a local driver, or an autonomous controller sufficient time ahead of the forecast network degradation to bring the vehicle 230 into a safe state.

The network prediction module 236 may also provide the forecast network condition to the compression engine 238. In an example implementation, the compression engine 238 may compress the video feed such that the compressed video feed 256 has parameters related to the forecast network condition. For example, if the forecast network condition comprises a predicted bandwidth or data rate, the compressed video feed 256 may be generated by the compression engine 238 such that the data rate of the compressed video feed 256 is provided in view of the predicted bandwidth or data rate. Specifically, the compressed video feed 256 may be generated such that the data rate is no greater than a predetermined percentage of the forecast network condition, where the predetermined percentage is less than 100%. As a result, a safety margin may be created such that the compressed video feed 256 may be transmitted at the compressed data rate even if network conditions are actually degraded relative to the forecast network condition. Moreover, utilization of the safety margin may help prevent unwanted conditions such as interruption, lagging, freezing, or other interruptions to the compressed video data feed. As can be appreciated, such conditions that hinder connectivity may create difficulty in a remote location utilizing data for remote control of the vehicle and can therefore hinder the safe operation of the vehicle. In an example scenario, if the network prediction module 236 indicates that the forecast network conditions include a bandwidth of 2 Mbps, the compression engine 238 may compress the video feed such that the data rate of the compressed video feed may be a portion, fraction, or percentage of the predicted 2 Mbps bandwidth (e.g., 80% of the forecast network condition, 75% of the forecast network condition, 70% of the forecast network condition, 65% of the forecast network condition, 60% of the forecast network condition, etc.) to provide a safety margin (e.g., representing the remaining portion of the available bandwidth). Implementations are contemplated in which the percentage, fraction, or portion of the available bandwidth or data rate allocated for the safety margin is dynamically determined based on rules or an inferential model applied to a forecast network condition (e.g., predicted available network bandwidth or data rate), a minimum network condition (a minimum bandwidth or data rate for real-time sensor data transmission), a data feed parameter (e.g., a data rate of the compressed sensor data to be transmitted), and a maximum data feed parameter (e.g., a predefined maximum data rate allowed).

In other examples, the plurality of sensor data feeds 252 may be provided as a plurality of separate feeds from the control module 234 to the compression engine 238 for individual compression of the sensor data feeds 252 prior to transmitting the individual sensor data feeds 252 via the network 220. In this regard, the control module 234 may alter the processing of the sensor data feeds 252 based on the forecast network condition as provided by the network prediction module 236 (e.g., to increase a bit rate of a prioritized sensor, reduce a bit rate of a non-prioritized sensor, or to increase or decrease the bit rate of all sensors) and/or based on the predictive input data 240. In turn, the control module 234 may provide distinct sensor data feeds to the compression engine 238. The compression engine 238 may thereby select different compression for application to the different respective sensor feeds based on the forecast network condition received by the network prediction module 236. This may allow for prioritized sensor data feeds to be compressed using a less lossy compression approach (e.g., a lossless compression), whereas the other sensor data feeds that have a reduced priority compared to the prioritized data feed may be compressed with a more aggressive, lossy compression, which may reduce the data rates of the sensor data at the cost of decreased image quality at the remote location 210.

The network prediction module 236 may generate the forecast network condition for some forecast time period (e.g., from the current time). In one example, the forecast time period may be at least 500 milliseconds (ms). Other examples may be provided in which the forecast time period is greater than or less than 500 ms. For example, the forecast time period may be as great as one second, or more, or less than 500 ms (e.g., 400 ms, 300 ms, 200 ms, etc.). By increasing the duration of the forecast time period, future network conditions that do not support the minimum network condition may be identified further in advance, which may allow greater time for a safety condition to be triggered and a safety operation to be performed. That is, network prediction module 236 may be able to identify network conditions that do not support minimum network conditions further in advance such that more time may be provided to control the vehicle 230 to render the vehicle 230 safe ahead of the anticipated network conditions that do not support remote control the vehicle.

As will be described in greater detail below, the network prediction module 236 may generate the forecast network condition by application of a predictive model to the predictive input data 240 (described in greater detail below). The predictive model may be a tuned algorithm or may be generated using machine learning or artificial intelligence. Examples of approaches to model training for generating and/or updating a predictive model are described further below.

The compression engine 238 may apply any one or more appropriate compressions to the video feed 254 to generate the compressed video feed 256. For example, the nature of the compression may be lossy or lossless compression. The extent of the compression is the percent, fraction, or portion of the size of the compressed sensor data relative to the raw sensor data provided by the sensors 232. The type of compression can vary with the type of data to be transmitted. For example, when the sensor data feeds 252 include video data included in the video feed 254 and compressed video feed 256, a video codec may be used in the compression. Example video codecs may be utilized, including, for example, H.264, H.265, Motion JPEG 2000, JPEG XS, MPEG codecs, etc. Other compression types include audio codecs, downsampling, or modifying frame rates.

Downsampling includes selectively removing some of the raw sensor data for the sensor data feeds 252 and/or video feed 254 to reduce the quality and/or quantity of the sensor data to be transmitted. For non-video sensor data, the data can be transmitted less frequently than the sample rate of the sensors. Modifying the frame rate modifies the number of images per unit of time included in the video feed 254. Increasing the time between when each frame is transmitted provides for each frame to be higher quality when transmission bandwidth is constrained. For example, halving the frame rate could allow for doubling the data size of each frame transmitted within the same time period while maintaining the same data rate. In implementations, the compression engine 238 may be configured to select or change the types of compression methods based on the extent, nature, or type of compression targeted by the compression engine.

Implementations are also contemplated in which the compression engine 238 includes an inferential model (e.g., a machine learning model). In one example, the inferential model is configured to receive compression inputs, such as uncompressed sensor data (e.g., the video feed 254 or the sensor data feeds 252 from the control module 234), one or more elements of the predictive input data 240, an actual (e.g., measured) network condition (e.g., a last measured available bandwidth to transmit the data signal over the network), and/or the forecast network condition (e.g., including a target bit rate or sensor data size). For example, the inferential model may be trained to receive as input the compression inputs and responsively output a compressed sensor feed (e.g., the compressed video feed 256). The compression engine 238 may additionally or alternatively include a rules-based model with predefined rules that determine the nature and extent of the compression based on the rules.

In another example, the inferential model is configured to receive at least the sensor data to be compressed and a predefined target data rate (e.g., a quantity of data per time or frame) or data size for transmission of the sensor data to be compressed, and the inferential model is configured to responsively output a compressed version of the sensor data that is transmissible substantially in real-time from the vehicle 230 at or below the target bit rate.

In these implementations, the inferential model may be trained using supervised learning by inputting a labeled version of the input data the inferential model is configured to receive into the inferential model, receiving output from the inferential model, comparing the output to labels (e.g., ground truth or actual values) assigned to the input data to determine a loss, and adjusting the inferential model to account for the loss (e.g., by backpropagation). The training can be conducted iteratively, repeating the inputting, receiving, comparing, and adjusting until the loss is reduced to a predefined amount. Training methods other than supervised learning are also contemplated, as described herein.

In implementations, the compression engine 238 is configured to output multiple instances of compressed sensor data with different levels of compression/quality for each forecast time point. For example, the compression engine may concurrently or serially output a larger compressed sensor data feed and a smaller compressed sensor data feed to be transmitted at a given time. The extent of compression of the larger compressed sensor data feed and the smaller compressed sensor data feed may be variable or static. For example, the smaller compressed sensor data feed may be a static predefined minimum level of quality (e.g., determined to be adequate for driving the vehicle 230 remotely), regardless of the actual network condition, or may be a dynamic predefined minimum level determined dynamically by the control module based on data, such as the forecast network condition, one or more elements of the predictive input data 240, and/or the raw sensor data feeds 252. In an implementation, the predefined minimum level may be determined dynamically based at least in part on historical minimum data rates that a service provider provided in areas at the times that the control module 234 or another element predicts the vehicle 230 will pass through the areas (e.g., based on the position, time, and trajectory data 248).

As shown in FIG. 2, the predictive input data 240 may comprise a plurality of sources. For example, the predictive input data 240 may include published network provider data 242 regarding network performance (e.g., available network resources). For example, network providers may publish data regarding the availability of a network in various locations and/or at various times and or the data speed supported by the network in various locations and/or at various times. Such information may be referenced by geography, may be published according to the capacity of various access points such as cellular towers, and/or may be referenced by time (e.g., date, time of day, day of the week, month, season, or relative to an event), or the like. In any regard, the published network provider data 242 may be provided to the network prediction module 236.

The predictive input data 240 may also include historical network data 244. Historic network data 244 may include measured network performance previously experienced by the vehicle 230 and/or other vehicles (e.g., vehicles in a given fleet of vehicles). The historical network data 244 may also contain data collected from other devices beyond the vehicle 230 or a fleet of vehicles, such as network conditions measured by other network users (e.g., including smartphones, cellular access devices, or other devices capable of accessing the network and recording actual network performance). The measured network performance previously experienced may be indexed or stored based on time and location data of the other vehicles so that the network prediction module 236 and/or the control module 234 can base a forecast network condition on the network performance experienced by other vehicles in similar locations at similar times to the times and locations of the path of the vehicle 230.

The predictive input data 240 may also include recent vehicle network performance data 246 regarding the network as experienced by the vehicle 230 or other vehicles. For example, the vehicle 230 may maintain actual round-trip times of recent historical packets transmitted via the network 220. This may include round-trip times for a predefined look-back period. Also, the recent vehicle network performance data 246 can include similar routes taken by the vehicle 230 in the past at similar times to help determine likely network performance along the route. Thus, the recent network performance (e.g., the round-trip time of data packets, data transmission rate, and/or bandwidth available for upload or download) at the vehicle 230 may be monitored and provided to the network prediction module 236.

The predictive input data 240 may also include position, time, and trajectory data 248. This may include, for example, a location of the vehicle 230. The location of vehicle 230 may be determined using a GPS receiver or the like. Furthermore, the vehicle trajectory (including speed and direction of travel) projected into the future may be included in the trajectory data 248. Such vehicle trajectory information may be generated based on measurements from inertial sensors, GPS sensors, or the like. The position, time, and trajectory data 248 may also include navigation data such as a projected route that the vehicle 230 will travel (e.g., as selected by a user or driver). In this regard, the position, time, and trajectory data 248 may include a projected path, route, or course of the vehicle 230. In addition, the position, time, and trajectory data 248 may include precise time information (e.g., as derived from onboard GPS receivers or the like). The path, route, or course may include predicted locations and predicted times at which the vehicle is expected to arrive at the predicted locations (e.g., based on predicted speeds, a current location, and a model of the trajectories to be taken).

The predictive input data 240 may also include remote terminal performance parameters 250 that relate to the network performance at the remote location 210. For example, in the event that the remote location 210 is a remote pilot of the vehicle 230 providing vehicle control data commands, the command latency of the remote location 210 may be included in the predictive input data 240.

The predictive input data 240 may also include feedback data 258. For example, the network prediction module 236 may also receive feedback data 258, which may be used for the improvement of the quality of the forecast network conditions. For example, the network prediction module 236 may receive information regarding the identification of situations in which the actual network performance encountered was higher than the forecast network conditions or where the actual network performance encountered was lower than the forecast network conditions (e.g., the available network resources are fewer than predicted). This may be used by the network prediction module 236 to refine a predictive model for the forecast network conditions. Additionally or alternatively, a service may receive the feedback data 258 and train or refine a new instance of a predictive model to be transmitted to the vehicle 230 as a new instance of the network prediction module 236. The feedback data 258 may also include log information regarding prior safety triggers. That is, in the event a safety trigger is initiated, information regarding that event, such as the forecast network conditions, actual network conditions experienced, actual remote location experience, or the like, may be logged and analyzed to refine the predictive model for the generation of forecast network conditions. Further still, the feedback data 258 may include remote user feedback. In addition, a remote user may have access to a control configured to override the triggering of a safety condition (e.g., in the event that the remote user determines the safety condition to be a falsely identified occurrence). This information and any information attendant to the override may be logged and provided as feedback data 258.

In addition, in the event that an anomaly in the data received at the remote location 210 is identified by a remote user, the remote user may identify the anomaly. In turn, information regarding that event, such as the forecast network conditions, actual network conditions experienced, actual remote location experience, or the like, may be logged and analyzed in connection with the identified anomaly to refine the predictive model for the generation of forecast network conditions.

Moreover, while the predictive input data 240 is shown as a single grouping, it may be appreciated the different ones of the predictive input data 240 may be provided by different sources. Thus, the network prediction module 236 may collate or otherwise arrange the predictive input data 240 for assistance in predicting the forecast network condition.

Figure 3:
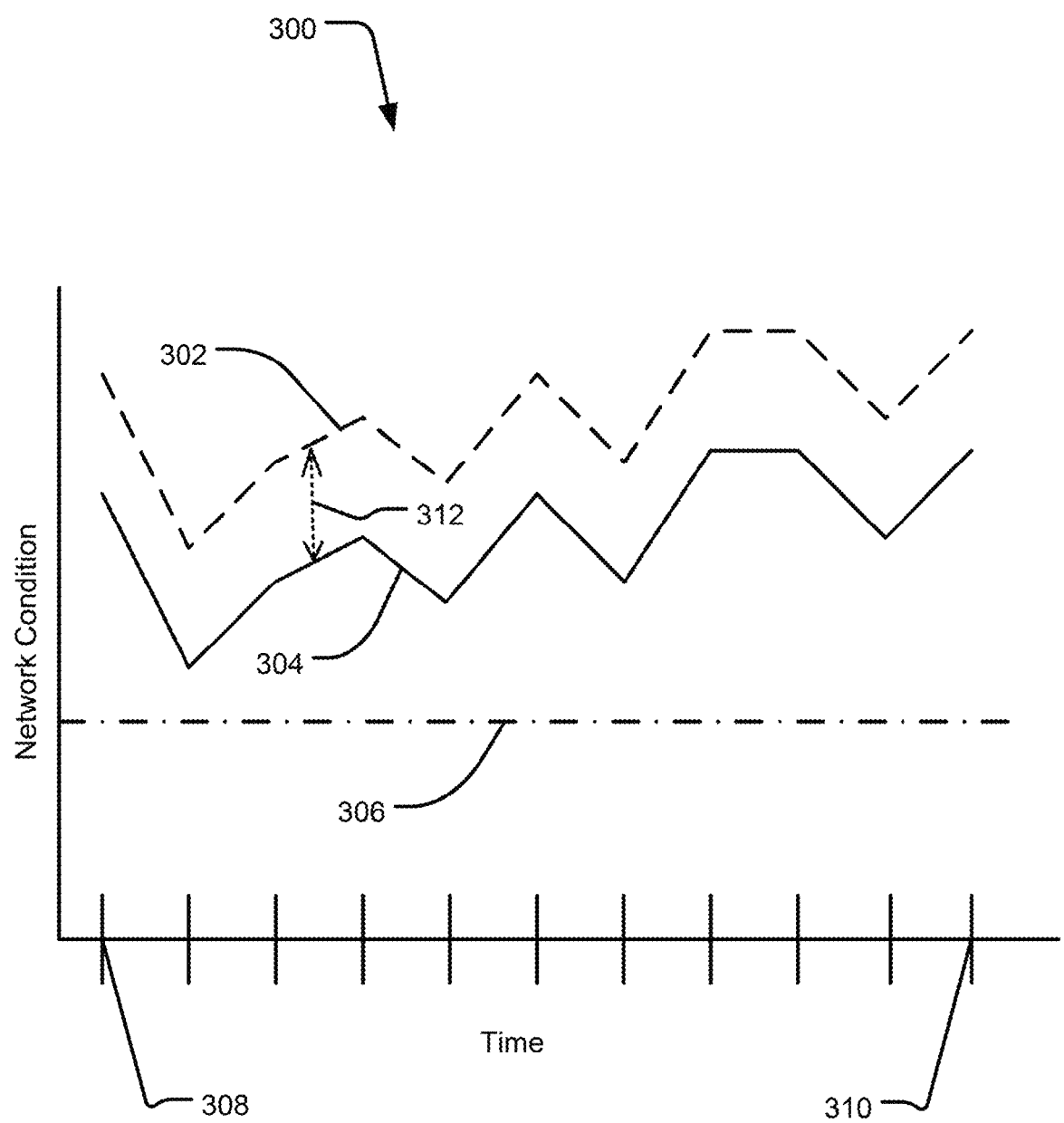
FIG. 3 illustrates a plot of an example forecast network condition.
Figure 4:
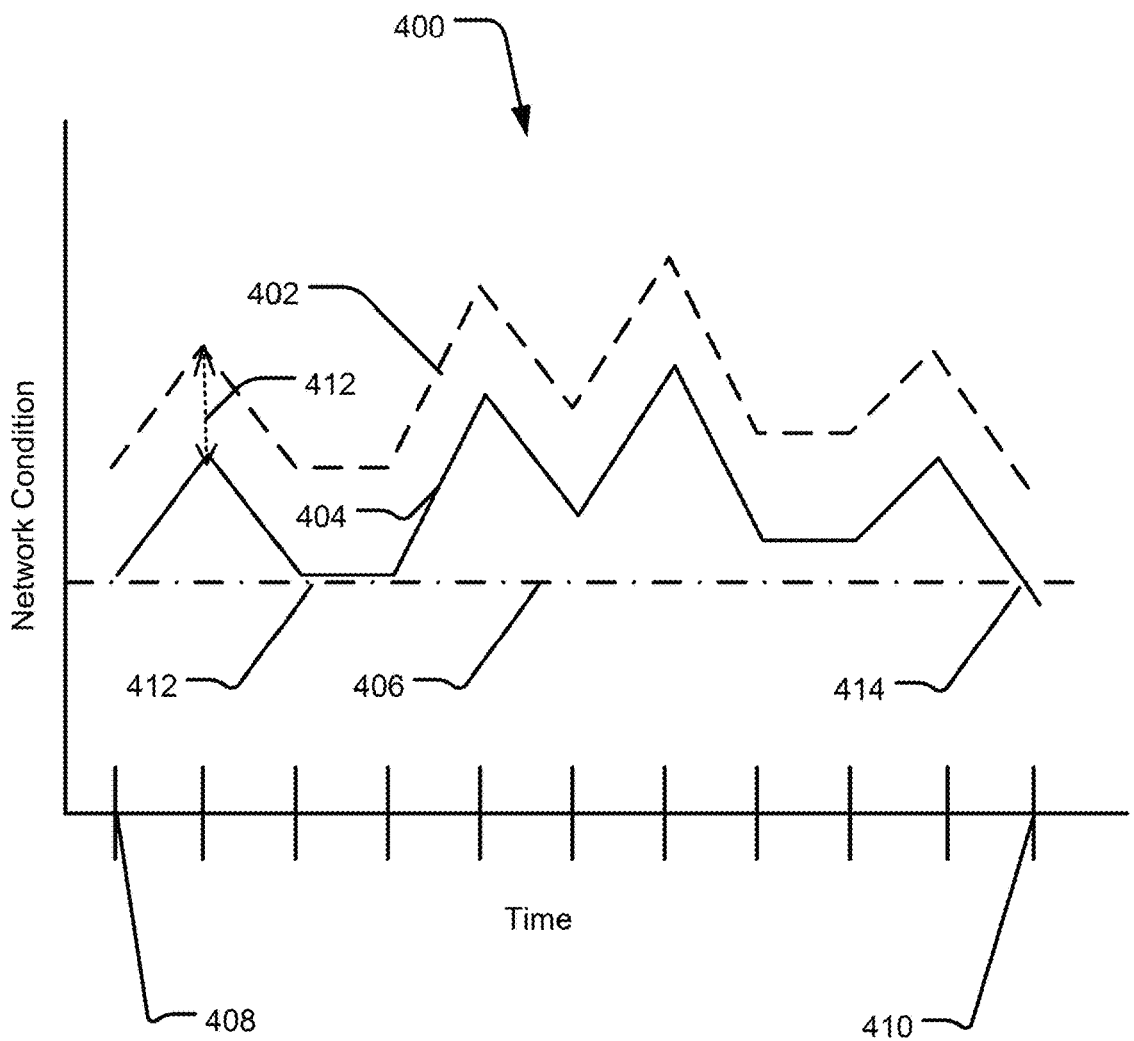
FIG. 4 illustrates another plot of an example forecast network condition.

Examples of data management according to the foregoing are generally illustrated in FIGS. 3 and 4. Specifically, FIG. 3 illustrates a plot 300 of an example forecast network condition. FIG. 3 depicts a plot 300 representative of a network condition parameter represented along the vertical axis. The illustrated network condition parameter may be a given network measure (e.g., bandwidth, latency, etc.) or an aggregate of a plurality of network conditions. The plot 300 also includes time on the horizontal axis with the depicted time period beginning at a current time 308 and including a projected time period through a future time 310. As noted above, the future time 310 may be 500 ms into the future, although larger or smaller values are also possible.

The plot 300 generally depicts a forecast network condition 302 as generated by a network prediction module for future network conditions. In turn, a data feed parameter 304 may also be determined in correspondence to the forecast network condition 302. For example, as described above, the forecast network condition 302 may comprise a bandwidth measure that is predicted for the network into the projected time period depicted in FIG. 3. In turn, the data feed parameter 304 may be generated based on the forecast network condition 302. Specifically, the data feed parameter 304 may correspond to an offset 312 from the forecast network condition 302, where the offset 312 represents that the data feed parameter 304 is some portion of the forecast network condition 302. Thus, the offset 312 may provide a safety margin as described above. The plot 300 also includes a minimum network condition 306 that may provide a minimum network parameter or set of network parameters to provide reliable data transmission from a vehicle to a remote location. In this regard, FIG. 3 may be illustrative of the feedback provided to the compression engine that allows the compression engine to prepare the data to be transmitted according to the data feed parameter 304.

A forecast network condition may also allow for the determination of potential occurrences in which the data feed parameter generated based on the forecast network condition falls below a minimum network condition. For example, FIG. 4 illustrates another plot of an example forecast network condition. The plot 400 includes a vertical axis that represents a network condition parameter and a horizontal axis that represents the time from a current time 408 to a forecast time 410 (e.g., representative of a forecast time period). Like in FIG. 3, the forecast network condition 402 may be generated by the network prediction module and provided such that the compression engine may utilize the forecast network condition 402 to develop a corresponding data feed parameter 404. The data feed parameter 404 may drive prioritization and/or compression of sensor data feeds from the vehicle. As can be appreciated, at a time 412, the data feed parameter 404 may approach the minimum network condition 406. This may trigger the logging of information around the time 412 (e.g., to collect all relevant information, including the forecast network condition, an actual network condition, a remote user experience, etc.).

In addition, it may be appreciated that at the end of the projected time period at forecast time 410, the data feed parameter 404 may fall below the minimum network condition 406 at intersection 414. As may be appreciated, this may be identified in advance such that the forecast network condition 402 may predict a time in the future at which the data feed parameter 404 may fall below the minimum network condition 406. Thus, a safety condition may be triggered, and the autonomous or remote pilot may, in response to the safety condition being triggered, pilot the vehicle into a safe location to allow the vehicle to stop or reroute to a location with historically better network service.

Returning to FIG. 2, the system 200 may also include a training module 260. The training module 260 is shown as being remote from the vehicle 230 and the remote location 210. However, in other examples, the training module 260 may be located at the vehicle 230 and/or the remote location 210. In any regard, the training module 260 may receive information regarding the predictive input data 240, the forecast network condition, actual network conditions experienced, and other appropriate information, such as experiential feedback from a remote user. The training module 260 may use this data to refine a predictive model. In turn, an updated predictive model may be provided to the network prediction module 236. For example, if actual network conditions were degraded as compared to forecast network conditions, the training module 260 may also identify all other relevant data (e.g., the predictive input data 240 or the like) to refine the model to account for any discrepancies. In this regard, the training module 260 may be iterative to refine the predictive model that is provided to and used by the network prediction module 236. The training module 260 may also receive such data from a plurality of vehicles for use in refining the predictive model.

Figure 5:
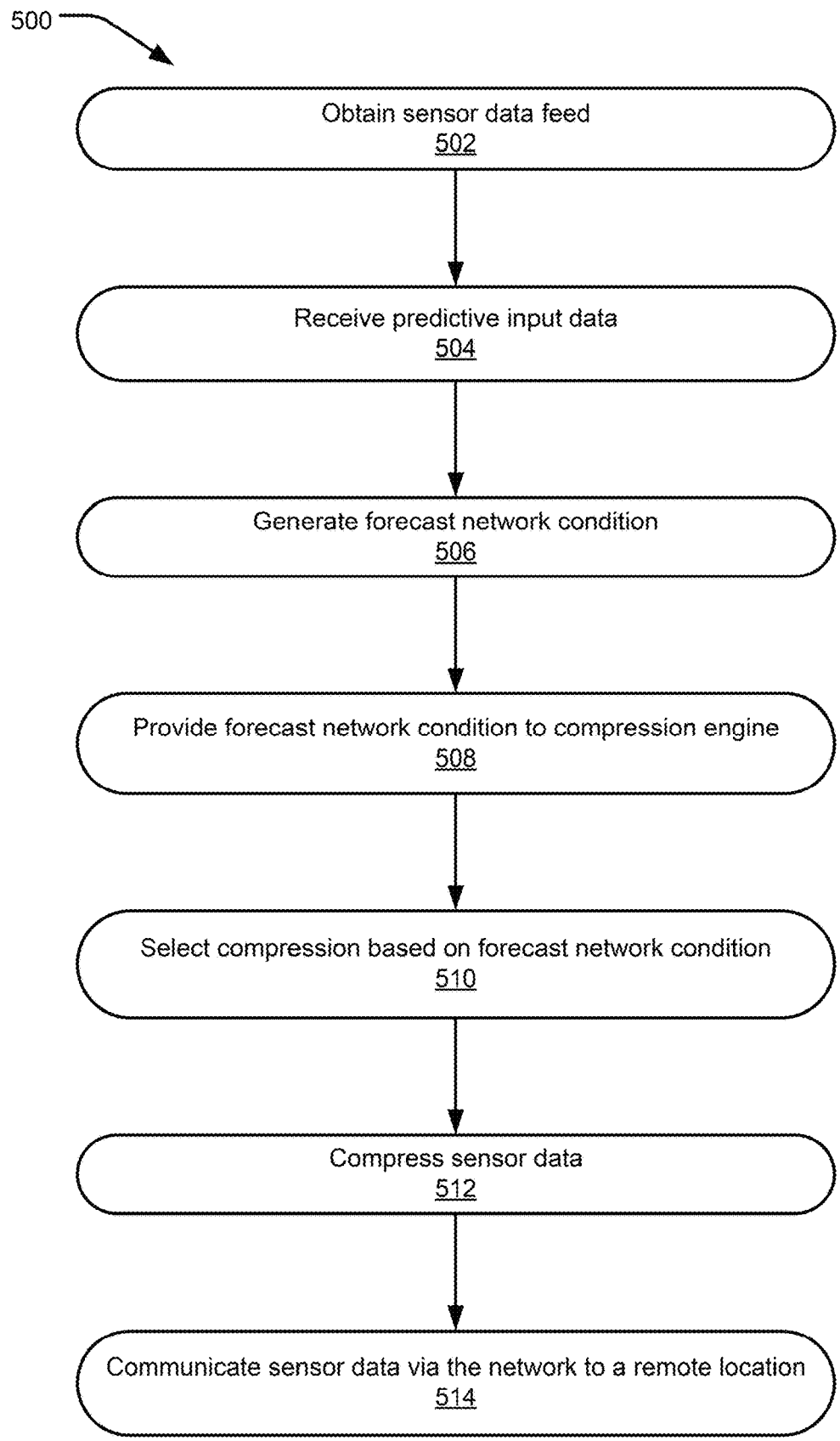
FIG. 5 illustrates an example process for communication of sensor data from a vehicle based on a forecast network condition.

FIG. 5 illustrates an example of a process 500 for communication of sensor data from a vehicle based on a forecast network condition. The process 500 may include an obtaining operation 502, in which sensor data at a vehicle is obtained. As noted above, the sensor data may include video data captured from one or more video cameras located at the vehicle.

The process 500 also may include a receiving operation 504 in which predictive input data is received at a network prediction module. As noted above, the predictive input data may be from one or more sources and may include any or all of the various different types of predictive input data noted above. The process 500 also may include a generating operation 506 in which a forecast network condition is generated. The generating operation 506 may include predicting what network conditions will be for some time from the current time. The generating operation 506 may be generated by the application of a predictive model that uses the predictive input data. The process 500 may include a providing operation 508 in which the forecast network condition is provided to a compression engine. The process 500 may also include a selection operation 510 in which the compression engine may select a compression to apply to the sensor data based on the forecast network condition. As noted above, the compression may be selected such that a resulting compressed data feed comprises a data rate that is less than the forecast network condition such that data may be reliably and continuously communicated in view of the forecast network condition.

The process 500 may include a compressing operation 512 in which the sensor data is compressed using the selected compression. In turn, the compressed sensor data having a data rate based on the forecast network condition may be communicated to a remote location in a communicating operation 514.

Figure 6:
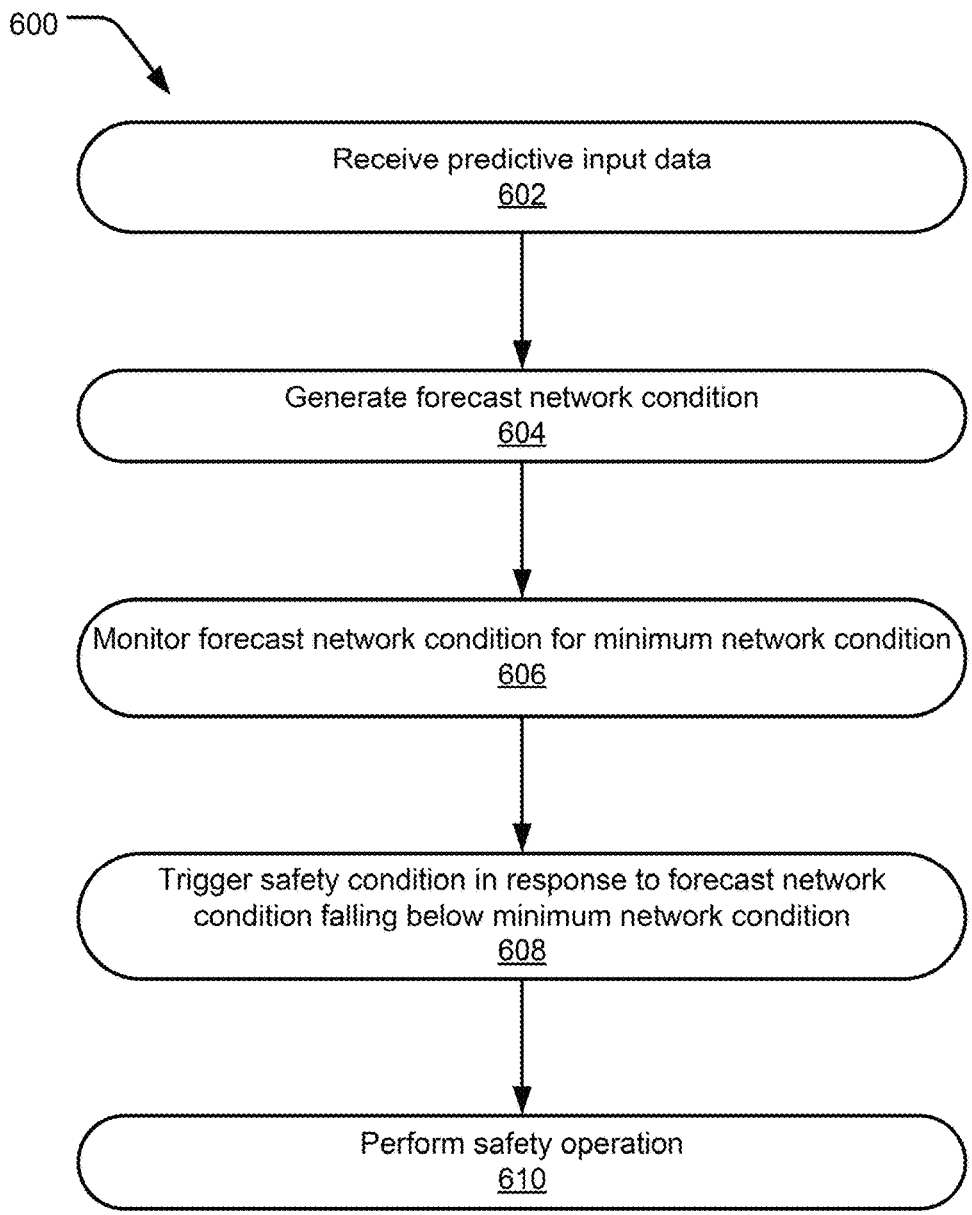
FIG. 6 illustrates an example process in which forecast network conditions are monitored to determine if sufficient network capacity is predicted to continue safe operation of a vehicle.

FIG. 6 illustrates an example process 600 in which forecast network conditions are monitored to determine if sufficient network conditions are predicted to continue the safe operation of a vehicle. The process 600 may include a receiving operation 602 in which predictive input data is received according to any or all of the teachings above. The process 600 may also include a generating operation 604 in which a forecast network condition is generated. The process 600 may include a monitoring operation 606 in which the forecast network condition is compared to a minimum network condition. If the forecast network condition falls below the minimum network condition, a triggering operation 608 may occur in which a safety condition is triggered. The triggering operation 608 may allow an onboard autonomous control system, a remote autonomous control system, and/or a remote pilot to perform a safety operation 610. The safety operation 610 may include bringing the vehicle to a stop in a safe location in anticipation of network conditions that may not support remote control of the vehicle.

Figure 7:
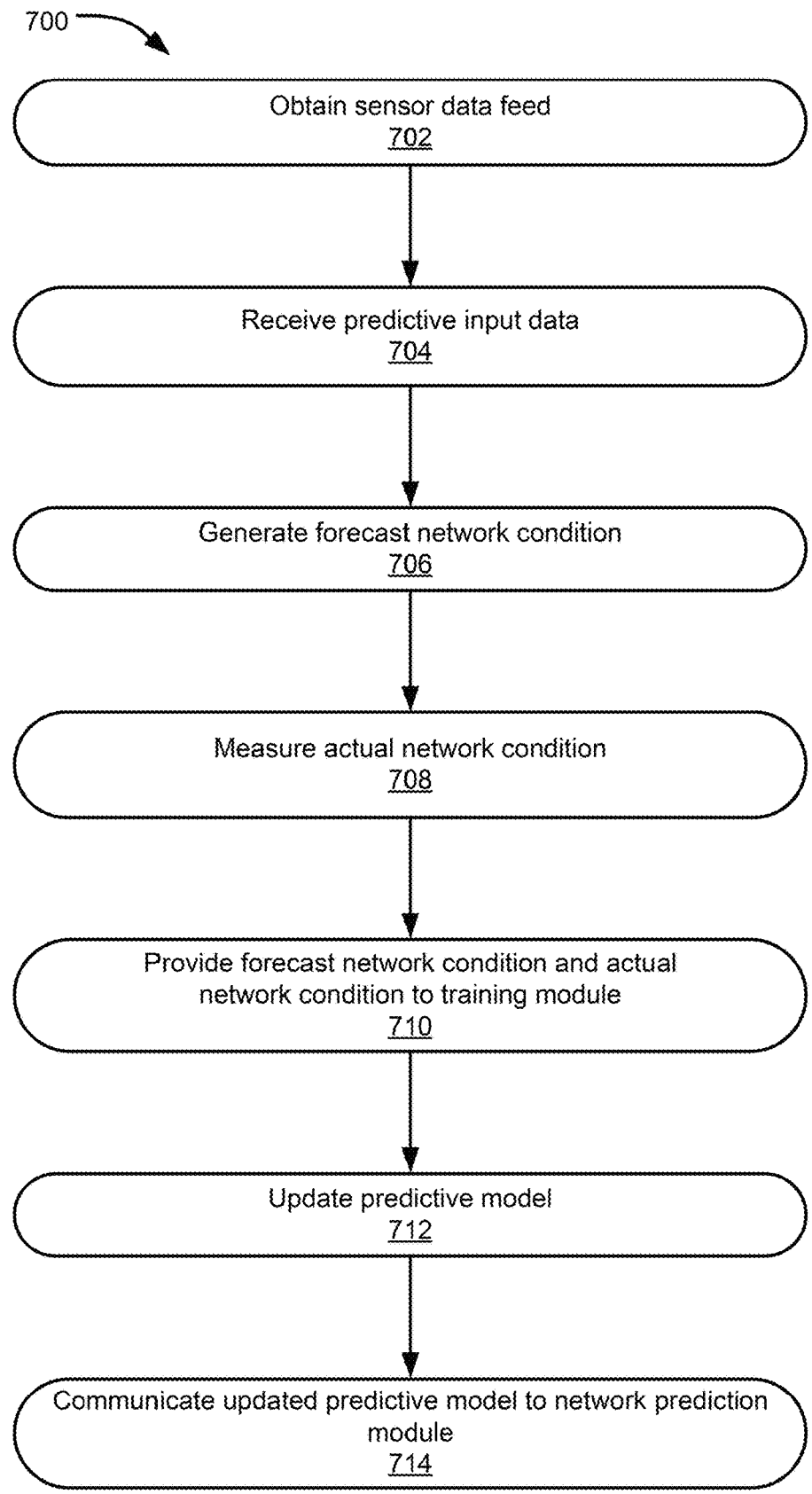
FIG. 7 illustrates an example process for refining a predictive model used to generate forecast network conditions.

FIG. 7 illustrates an example process 700 for refining a predictive model used to generate forecast network conditions. The process 700 may include an obtaining operation 702, in which sensor data is obtained. A receiving operation 704 may include receiving predictive input data. In turn, a generating operation 706 may include generating a forecast network condition.

The process 700 may also include measuring actual network conditions experienced by the vehicle in a measuring operation 708. That is, the measuring operation 708 may allow for actual network conditions to be recorded that can be compared to what the forecast network condition was for a given time. As such, a providing operation 710 may include providing the forecast network condition for a given time and the actual network condition for the given time to a training module. The training module may perform an updating operation 712 in which the predictive model used in the generating operation 706 may be updated based on the forecast network condition for a given time and the actual network condition for the given time to refine the predictive model. Other information may be used in the updating operation 712, as noted above. In any regard, the process 700 may include a communicating operation 714 in which the updated predictive model may be provided to a network prediction module.

Figure 8:
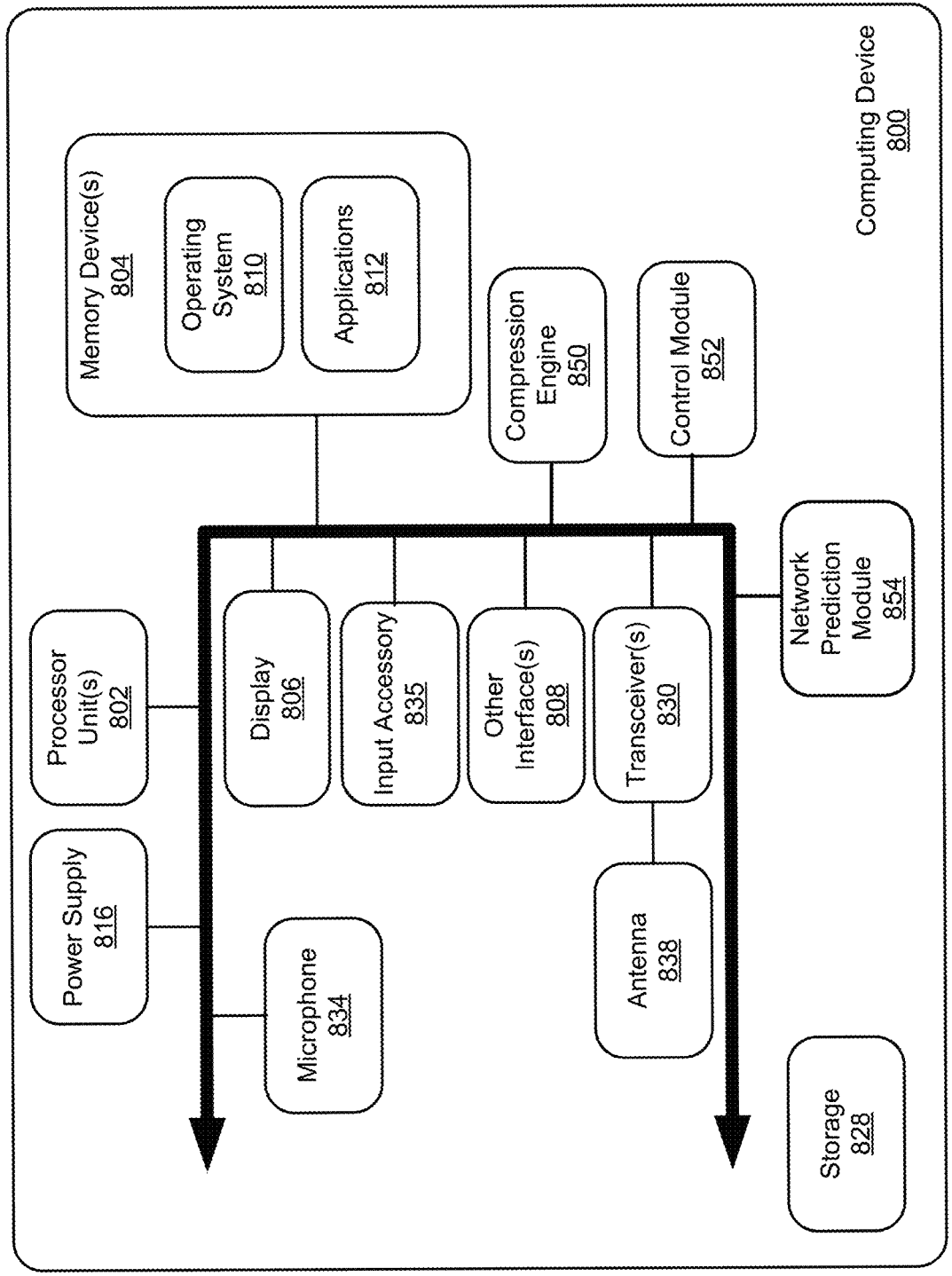
FIG. 8 illustrates an example computing device for use in implementing the described technology.

FIG. 8 illustrates an example schematic of a computing device 800 suitable for implementing aspects of the disclosed technology, including a compression engine 850, a control module 852, and/or a network prediction module 854, as described above. The computing device 800 includes one or more processor unit(s) 802, memory 804, a display 806, and other interfaces 808 (e.g., buttons). The memory 804 generally includes both volatile memory (e.g., RAM) and non-volatile memory (e.g., flash memory). An operating system 810, such as the Microsoft Windows® operating system, the Apple macOS operating system, or the Linux operating system, resides in the memory 804 and is executed by the processor unit(s) 802, although it should be understood that other operating systems may be employed.

One or more applications 812 are loaded in the memory 804 and executed on the operating system 810 by the processor unit(s) 802. Applications 812 may receive input from various input local devices such as a microphone 834, input accessory 835 (e.g., keypad, mouse, stylus, touchpad, joystick, instrument mounted input, or the like). Additionally, the applications 812 may receive input from one or more remote devices, such as remotely-located smart devices, by communicating with such devices over a wired or wireless network using more communication transceivers 830 and an antenna 838 to provide network connectivity (e.g., a mobile phone network, Wi-Fi®, Bluetooth®). The computing device 800 may also include various other components, such as a positioning system (e.g., a global positioning satellite transceiver), one or more accelerometers, one or more cameras, an audio interface (e.g., the microphone 834, an audio amplifier and speaker and/or audio jack), and/or storage devices 828. Other configurations may also be employed.

The computing device 800 further includes a power supply 816, which is powered by one or more batteries or other power sources and which provides power to other components of the computing device 800. The power supply 816 may also be connected to an external power source (not shown) that overrides or recharges the built-in batteries or other power sources.

In implementations, any of the compression engine 850, control module 852, and/or network prediction module 854 may include an inferential mode (e.g., a machine learning model) and/or an inferential model trainer. Examples of model structures of the inferential model may include without limitation, a machine learning model, a data mining algorithm, an artificial intelligence algorithm, a masked learning model, a natural language processing model, a neural network, an artificial neural network, a perceptron, a feed-forward network, a radial basis neural network, a deep feed-forward neural network, a recurrent neural network, a long/short term memory network, a gated recurrent neural network, an autoencoder, a variational autoencoder, a denoising autoencoder, a sparse autoencoder, a Bayesian network, a regression model, a decision tree, a Markov chain, a Hopfield network, a Boltzmann machine, a restricted Boltzmann machine, a deep belief network, a deep convolutional network, a genetic algorithm, a deconvolutional neural network, a deep convolutional inverse graphics network, a generative adversarial network, a liquid state machine, an extreme learning machine, an echo state network, a deep residual network, a Kohonen network, a support vector machine, a federated learning model, or a neural Turing machine. In implementations, the inferential model trainer may train the inferential model using an inference model training method. In this specification, examples of training methods (e.g., inferential and/or machine learning methods) can include, without limitation, one or more of masked learning modeling, unsupervised learning, supervised learning, reinforcement learning, self-learning, feature learning, sparse dictionary learning, anomaly detection, robot learning, association rule learning, manifold learning, dimensionality reduction, bidirectional transformation, unidirectional transformation, gradient descent, autoregression, autoencoding, permutation language modeling, two-stream self attenuation, federated learning, absorbing transformer-XL, natural language processing (NLP), validation, or the like.

In an example implementation, the computing device 800 comprises hardware and/or software embodied by instructions stored in the memory 804 and/or the storage devices 828 and processed by the processor unit(s) 802. The memory 804 may be the memory of a host device or of an accessory that couples to the host. Additionally or alternatively, the computing device 800 may comprise one or more of a field programmable gate array (FGPA), an application-specific integrated circuit (ASIC), or other hardware/software/firmware capable of providing the functionality described herein.

The computing device 800 may include a variety of tangible processor-readable storage media and intangible processor-readable communication signals. Tangible processor-readable storage can be embodied by any available media that can be accessed by the computing device 800 and includes both volatile and non-volatile storage media, removable and non-removable storage media. Tangible processor-readable storage media excludes intangible communications signals (e.g., signals per se) and includes volatile and non-volatile, removable and non-removable storage media implemented in any method or technology for storage of information such as processor-readable instructions, data structures, program modules, or other data. Tangible processor-readable storage media includes but is not limited to RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information and which can be accessed by the computing device 800. In contrast to tangible processor-readable storage media, intangible processor-readable communication signals may embody processor-readable instructions, data structures, program modules, or other data resident in a modulated data signal, such as a carrier wave or other signal transport mechanism. The term "modulated data signal" means an intangible communications signal that has one or more of its characteristics set or changed in such a manner as to encode information in the signal. By way of example, and not limitation, intangible communication signals include signals traveling through wired media such as a wired network or direct-wired connection, and wireless media such as acoustic, RF, infrared, and other wireless media.

Clause 1. A method for data management of vehicle data for communication to a remote location, the method comprising: obtaining one or more sensor data feeds from one or more onboard sensors of a vehicle; generating a forecast network condition for a network with which the vehicle is in operative communication, the forecast network condition representing predicted network resources the network is predicted to provide to the vehicle; providing the forecast network condition to a compression engine; and compressing the one or more sensor data feeds into a compressed data feed for communication over the network to a remote location, wherein the compressed data feed is compressed based on the forecast network condition.

Clause 2. The method of clause 1, wherein the compression engine receives an aggregated data feed comprising a plurality of the one or more sensor data feeds, and wherein the compressing further comprises: selecting one or more compressions for application to the aggregated data feed such that a data rate of the aggregated data feed comprises a portion of the predicted network resources represented by the forecast network condition.

Clause 3. The method of clause 2, further comprising: aggregating the plurality of the one or more sensor data feeds at a control module of the vehicle to generate the aggregated data feed.

Clause 4. The method of clause 3, wherein the aggregating comprises assigning variable data rates to apply different compressions of the one or more compressions to each of at least two of the plurality of the one or more sensor data feeds based on the forecast network condition.

Clause 5. The method of clause 4, wherein the variable data rates are assigned to the plurality of the one or more sensor data feeds based on an operational condition of the vehicle representing a state of the vehicle or of a component of the vehicle.

Clause 6. The method of clause 1, wherein the forecast network condition is generated based on predictive input data.

Clause 7. The method of clause 6, wherein the predictive input data comprises one or more of published network provider data; historical network data; recent vehicle network performance data; position, time, and trajectory data; remote terminal performance data; or feedback data.

Clause 8. The method of clause 1, wherein a data rate of the compressed data feed comprises a predefined portion of a data rate of the predicted network resources represented by the forecast network condition.

Clause 9. The method of clause 1, further comprising: monitoring the forecast network condition in relation to a minimum network condition representing a predefined threshold level of network resources; and triggering a safety condition in response to the predicted network resources of the forecast network condition dropping below the predefined threshold level of network resources.

Clause 10. The method of clause 1, wherein forecast network conditions including the forecast network condition are generated for a period of not less than 500 ms from a current time.

Clause 11. The method of clause 1, further comprising: providing at least the forecast network condition and an actual network condition for a given time to a training module; and refining a predictive model used to generate the forecast network condition based on at least the forecast network condition and the actual network condition for the given time.

Clause 12. The method of clause 1, wherein the remote location comprises: a remote terminal configured to provide remote control of the vehicle to a remote operator; or a remote autonomous operation system configured to remotely control the vehicle.

Clause 13. The method of clause 1, wherein the forecast network condition represents predicted network resources the network is predicted to provide to the vehicle at at least one time and at least one place along a predetermine path of the vehicle.

Clause 14. An onboard vehicle system for generating forecast network conditions for data management of sensor data at a vehicle, the onboard vehicle system comprising: at least one sensor that generates a sensor data feed; a communication module in operative communication with a network; a network prediction module operative to generate a forecast network condition for the network with which the communication module is in operative communication, the forecast network condition representing predicted network resources the network is predicted to provide to the vehicle; and a compression engine operative to compress the sensor data feed, wherein the compression engine receives the forecast network condition and compresses the sensor data feed based on the forecast network condition for communication of a compressed sensor data feed by the communication module to a remote location via the network.

Clause 15. The onboard vehicle system of clause 14, comprising: a plurality of sensors including the at least one sensor configured to generate a plurality of sensor data feeds; wherein the compression engine receives an aggregated data feed comprising the plurality of sensor data feeds, and wherein the compression engine selects one or more compressions for application to the aggregated data feed such that a data rate of the aggregated data feed comprises a portion of a data rate of the forecast network condition.

Clause 16. The onboard vehicle system of clause 15, further comprising: a control module operative to aggregate the plurality of sensor data feeds to generate the aggregated data feed.

Clause 17. The onboard vehicle system of clause 16, wherein the control module assigns variable data rates to apply different compressions of the one or more compressions to each of at least two of the plurality of sensor data feeds based on the forecast network condition.

Clause 18. The onboard vehicle system of clause 17, wherein the variable data rates are assigned to the plurality of sensor data feeds based on an operational condition of the vehicle representing a state of the vehicle or of a component of the vehicle.

Clause 19. The onboard vehicle system of clause 14, wherein the forecast network condition is generated based on predictive input data.

Clause 20. The onboard vehicle system of clause 19, wherein the predictive input data comprises one or more of published network provider data; historical network data; recent vehicle network performance data; position, time, and trajectory data; remote terminal performance data; or feedback data.

Clause 21. The onboard vehicle system of clause 14, wherein a data rate of the compressed sensor data feed comprises a predefined portion of a data rate of the predicted network resources represented by the forecast network condition.

Clause 22. The onboard vehicle system of clause 14, wherein the compression engine is operative to: monitor the forecast network condition in relation to a minimum network condition representing a predefined threshold level of network resources; and trigger a safety condition in response to the predicted network resources of the forecast network condition dropping below the predicted threshold level of network resources.

Clause 23. The onboard vehicle system of clause 14, wherein the forecast network conditions are generated for a period of not less than 500 ms from a current time.

Clause 24. The onboard vehicle system of clause 14, further comprising: a training module operative to receive at least the forecast network condition and an actual network condition for a given time to refine a predictive model used by the network prediction module to generate the forecast network conditions based on at least the forecast network condition and the actual network condition.

Clause 25. The onboard vehicle system of clause 14, wherein the remote location comprises: a remote terminal operable by a remote operator to remotely control the vehicle; or a remote autonomous operation system configured to remotely control the vehicle.

Clause 26. The onboard vehicle system of clause 14, wherein the forecast network condition represents predicted network resources the network is predicted to provide to the vehicle at at least one time and at least one place along a predetermined path of the vehicle.

An example system for data management of vehicle data for communication to a remote location is provided, the system comprising means for obtaining one or more sensor data feeds from one or more onboard sensors of a vehicle; means for generating a forecast network condition for a network with which the vehicle is in operative communication, the forecast network condition representing predicted network resources the network is predicted to provide to the vehicle; means for providing the forecast network condition to a compression engine; means for compressing the one or more sensor data feeds into a compressed data feed for communication over the network to a remote location, wherein the compressed data feed is compressed based on the forecast network condition.

Another example system of any disclosed system is provided, wherein the compression engine receives an aggregated data feed comprising a plurality of the one or more sensor data feeds, and wherein the means for compressing further comprises means for selecting one or more compressions for application to the aggregated data feed such that a data rate of the aggregated data feed comprises a portion of the predicted network resources represented by the forecast network condition.

Another example system of any disclosed system is provided, further comprising means for aggregating the plurality of the one or more sensor data feeds at a control module of the vehicle to generate the aggregated data feed.

Another example system of any disclosed system is provided, wherein the aggregating comprises assigning variable data rates to apply different compressions of the one or more compressions to each of at least two of the plurality of the one or more sensor data feeds based on the forecast network condition.

Another example system of any disclosed system is provided wherein the variable data rates are assigned to the plurality of the one or more sensor data feeds based on an operational condition of the vehicle representing a state of the vehicle or of a component of the vehicle.

Another example system of any disclosed system is provided, wherein the forecast network condition is generated based on predictive input data.

Another example system of any disclosed system is provided, wherein the predictive input data comprises one or more of published network provider data; historical network data; recent vehicle network performance data; position, time, and trajectory data; remote terminal performance data; or feedback data.

Another example system of any disclosed system is provided, wherein a data rate of the compressed data feed comprises a predefined portion of a data rate of the predicted network resources represented by the forecast network condition.

Another example system of any disclosed system is provided, further comprising means for monitoring the forecast network condition in relation to a minimum network condition representing a predefined threshold level of network resources; and means for triggering a safety condition in response to the predicted network resources of the forecast network condition dropping below the predefined threshold level of network resources.

Another example system of any disclosed system is provided, wherein forecast network conditions including the forecast network condition are generated for a period of not less than 500 ms from a current time.

Another example system of any disclosed system is provided, further comprising means for providing at least the forecast network condition and an actual network condition for a given time to a training module; and means for refining a predictive model used to generate the forecast network condition based on at least the forecast network condition and the actual network condition for the given time. Another example system of any disclosed system is provided, wherein the remote location comprises a remote terminal configured to provide remote control of the vehicle to a remote operator; or a remote autonomous operation system configured to remotely control the vehicle.

Another example system of any disclosed system is provided, wherein the forecast network condition represents predicted network resources the network is predicted to provide to the vehicle at at least one time and at least one place along a predetermined path of the vehicle.

Some implementations may comprise an article of manufacture, which excludes software per se. An article of manufacture may comprise a tangible storage medium to store logic and/or data. Examples of a storage medium may include one or more types of computer-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, operation segments, methods, procedures, software interfaces, application program interfaces (API), instruction sets, computing code, computer code, code segments, computer code segments, words, values, symbols, or any combination thereof. In one implementation, for example, an article of manufacture may store executable computer program instructions that, when executed by a computer, cause the computer to perform methods and/or operations in accordance with the described embodiments. The executable computer program instructions may include any suitable type(s) of code, such as source code, compiled code, interpreted code, executable code, static code, dynamic code, and the like. The executable computer program instructions may be implemented according to a predefined computer language, manner, or syntax, for instructing a computer to perform a certain operation segment. The instructions may be implemented using any suitable high-level, low-level, object-oriented, visual, compiled, and/or interpreted programming language.

The implementations described herein may be implemented as logical steps in one or more computer systems. The logical operations may be implemented (1) as a sequence of processor-implemented steps executing in one or more computer systems or (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order unless explicitly claimed otherwise or a specific order is inherently necessitated by the claim language.

While this specification contains many specific implementation details, these should not be construed as limitations on the scope of any technologies or of what may be claimed but rather as descriptions of features specific to particular implementations of the particular described technology. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can, in some cases, be excised from the combination, and the claimed combination may be directed to a sub-combination or variation of a sub-combination. Other implementations are within the scope of the following claims. Nevertheless, it will be understood that various modifications can be made without departing from the spirit and scope of the recited claims.

What is claimed is:

1. A method for data management of vehicle data for communication to a remote location, the method comprising:

obtaining one or more sensor data feeds from one or more onboard sensors of a vehicle;

generating a forecast network condition for a network with which the vehicle is in operative communication, the forecast network condition representing predicted network resources the network is predicted to provide to the vehicle;

providing the forecast network condition to a compression engine; and compressing the one or more sensor data feeds into a compressed data feed for communication over the network to a remote location, wherein the compressed data feed is compressed based on the forecast network condition, wherein the compression engine receives an aggregated data feed comprising a plurality of the one or more sensor data feeds, and wherein the compressing further comprises:
  selecting one or more compressions for application to the aggregated data feed such that a data rate of the aggregated data feed comprises a portion of the predicted network resources represented by the forecast network condition.

2. The method of claim 1, further comprising:
  aggregating the plurality of the one or more sensor data feeds at a control module of the vehicle to generate the aggregated data feed.

3. The method of claim 2, wherein the aggregating comprises assigning variable data rates to apply different compressions of the one or more compressions to each of at least two of the plurality of the one or more sensor data feeds based on the forecast network condition.

4. The method of claim 3, wherein the variable data rates are assigned to the plurality of the one or more sensor data feeds based on an operational condition of the vehicle representing a state of the vehicle or of a component of the vehicle.

5. The method of claim 1, wherein the forecast network condition is generated based on predictive input data.

6. The method of claim 5, wherein the predictive input data comprises one or more of published network provider data; historical network data; recent vehicle network performance data; position, time, and trajectory data; remote terminal performance data; or feedback data.

7. The method of claim 1, wherein a data rate of the compressed data feed comprises a predefined portion of a data rate of the predicted network resources represented by the forecast network condition.

8. The method of claim 1, further comprising:
  monitoring the forecast network condition in relation to a minimum network condition representing a predefined threshold level of network resources; and
  triggering a safety condition in response to the predicted network resources of the forecast network condition dropping below the predefined threshold level of network resources.

9. The method of claim 1, wherein forecast network conditions including the forecast network condition are generated for a period of not less than 500 ms from a current time.

10. The method of claim 1, further comprising:
  providing at least the forecast network condition and an actual network condition for a given time to a training module; and
  refining a predictive model used to generate the forecast network condition based on at least the forecast network condition and the actual network condition for the given time.

11. The method of claim 1, wherein the remote location comprises:
  a remote terminal configured to provide remote control of the vehicle to a remote operator; or
  a remote autonomous operation system configured to remotely control the vehicle.

12. The method of claim 1, wherein the forecast network condition represents predicted network resources the network is predicted to provide to the vehicle at [at] least one time and at least one place along a predetermined path of the vehicle.

13. An onboard vehicle system for generating forecast network conditions for data management of sensor data at a vehicle, the onboard vehicle system comprising:
  at least one sensor that generates a sensor data feed;
  a communication module in operative communication with a network;
  a network prediction module operative to generate a forecast network condition for the network with which the communication module is in operative communication, the forecast network condition representing predicted network resources the network is predicted to provide to the vehicle; and
  a compression engine operative to compress the sensor data feed, wherein the compression engine receives the forecast network condition and compresses the sensor data feed based on the forecast network condition for communication of a compressed sensor data feed by the communication module to a remote location via the network
  a plurality of sensors including the at least one sensor configured to generate a plurality of sensor data feeds;
  wherein the compression engine receives an aggregated data feed comprising the plurality of sensor data feeds, and wherein the compression engine selects one or more compressions for application to the aggregated data feed such that a data rate of the aggregated data feed comprises a portion of a data rate of the forecast network condition.

14. The onboard vehicle system of claim 13, further comprising:
  a control module operative to aggregate the plurality of sensor data feeds to generate the aggregated data feed.

15. The onboard vehicle system of claim 14, wherein the control module assigns variable data rates to apply different compressions of the one or more compressions to each of at least two of the plurality of sensor data feeds based on the forecast network condition.

16. The onboard vehicle system of claim 15, wherein the variable data rates are assigned to the plurality of sensor data feeds based on an operational condition of the vehicle representing a state of the vehicle or of a component of the vehicle.

17. The onboard vehicle system of claim 13, wherein the forecast network condition is generated based on predictive input data.

18. The onboard vehicle system of claim 17, wherein the predictive input data comprises one or more of published network provider data; historical network data; recent vehicle network performance data; position, time, and trajectory data; remote terminal performance data; or feedback data.

19. The onboard vehicle system of claim 13, wherein a data rate of the compressed sensor data feed comprises a predefined portion of a data rate of the predicted network resources represented by the forecast network condition.

20. The onboard vehicle system of claim 13, wherein the compression engine is operative to:
  monitor the forecast network condition in relation to a minimum network condition representing a predefined threshold level of network resources; and
  trigger a safety condition in response to the predicted network resources of the forecast network condition dropping below the predicted threshold level of network resources.

21. The onboard vehicle system of claim 13, wherein the forecast network conditions are generated for a period of not less than 500 ms from a current time.

22. The onboard vehicle system of claim 13, further comprising:
a training module operative to receive at least the forecast network condition and an actual network condition for a given time to refine a predictive model used by the network prediction module to generate the forecast network conditions based on at least the forecast network condition and the actual network condition.

23. The onboard vehicle system of claim 13, wherein the forecast network condition represents predicted network resources the network is predicted to provide to the vehicle at least one time and at least one place along a predetermined path of the vehicle.

24. An onboard vehicle system for generating forecast network conditions for data management of sensor data at a vehicle, the onboard vehicle system comprising:
at least one sensor that generates a sensor data feed;
a communication module in operative communication with a network;
a network prediction module operative to generate a forecast network condition for the network with which the communication module is in operative communication, the forecast network condition representing predicted network resources the network is predicted to provide to the vehicle; and
a compression engine operative to compress the sensor data feed, wherein the compression engine receives the forecast network condition and compresses the sensor data feed based on the forecast network condition for communication of a compressed sensor data feed by the communication module to a remote location via the network;
wherein the remote location comprises:
a remote terminal operable by a remote operator to remotely control the vehicle; or
a remote autonomous operation system configured to remotely control the vehicle.

* * * * *